US012732135B2

(12) United States Patent
Uno

(10) Patent No.: US 12,732,135 B2
(45) Date of Patent: Sep. 8, 2026

(54) CIRCUIT APPARATUS AND OSCILLATOR

(71) Applicant: SEIKO EPSON CORPORATION, Tokyo (JP)

(72) Inventor: Tomohiro Uno, Chino (JP)

(73) Assignee: SEIKO EPSON CORPORATION, Tokyo (JP)

(*) Notice: Subject to any disclaimer, the term of this patent is extended or adjusted under 35 U.S.C. 154(b) by 0 days.

(21) Appl. No.: 19/002,017

(22) Filed: Dec. 26, 2024

(65) Prior Publication Data

US 2025/0219579 A1 Jul. 3, 2025

(30) Foreign Application Priority Data

Dec. 28, 2023 (JP) ................................ 2023-222299

(51) Int. Cl.

| | |
|---|---|
| ***H03B 5/04*** | (2006.01) |
| ***H03B 5/32*** | (2006.01) |
| ***H03L 7/08*** | (2006.01) |
| ***H03L 7/091*** | (2006.01) |
| ***H03L 7/095*** | (2006.01) |
| ***H03L 7/099*** | (2006.01) |
| ***H03L 7/10*** | (2006.01) |

(52) U.S. Cl.

CPC ................. *H03B 5/04* (2013.01); *H03B 5/32* (2013.01); *H03L 7/0805* (2013.01); *H03L 7/091* (2013.01); *H03L 7/095* (2013.01); *H03L 7/099* (2013.01); *H03L 7/105* (2013.01); *H03L 2207/14* (2013.01)

(58) Field of Classification Search

CPC ... H03L 7/0805; H03L 7/105; H03L 2207/14; H03L 7/099; H03L 7/085; H03L 7/095; Y10S 331/02; H03B 5/32; H03B 5/04

See application file for complete search history.

(56) References Cited

U.S. PATENT DOCUMENTS

| | | | | |
|---|---|---|---|---|
| 5,864,572 A * | 1/1999 | Bhagwan | G06F 1/04 | 714/799 |
| 2023/0268883 A1* | 8/2023 | Seo | H03L 1/022 | 331/70 |

FOREIGN PATENT DOCUMENTS

| | | |
|---|---|---|
| JP | 2006180349 A * | 7/2006 |
| JP | 2010124103 A * | 6/2010 |
| JP | 2023-105925 A | 8/2023 |

* cited by examiner

*Primary Examiner* — Ryan Johnson

(74) *Attorney, Agent, or Firm* — Rankin, Hill & Clark LLP

(57) ABSTRACT

A circuit apparatus includes: a first oscillation circuit configured to generate a first clock signal; a PLL circuit including a second oscillation circuit configured to generate a second clock signal and a frequency control voltage generation circuit configured to generate a frequency control voltage for controlling a frequency of the second clock signal, the PLL circuit being configured to synchronize a phase of the second clock signal with a phase of the first clock signal; and a failure detection circuit configured to monitor the frequency control voltage and detect whether there is a possibility that the frequency control voltage deviates from a predetermined voltage range in which the second oscillation circuit is capable of operating normally.

7 Claims, 8 Drawing Sheets

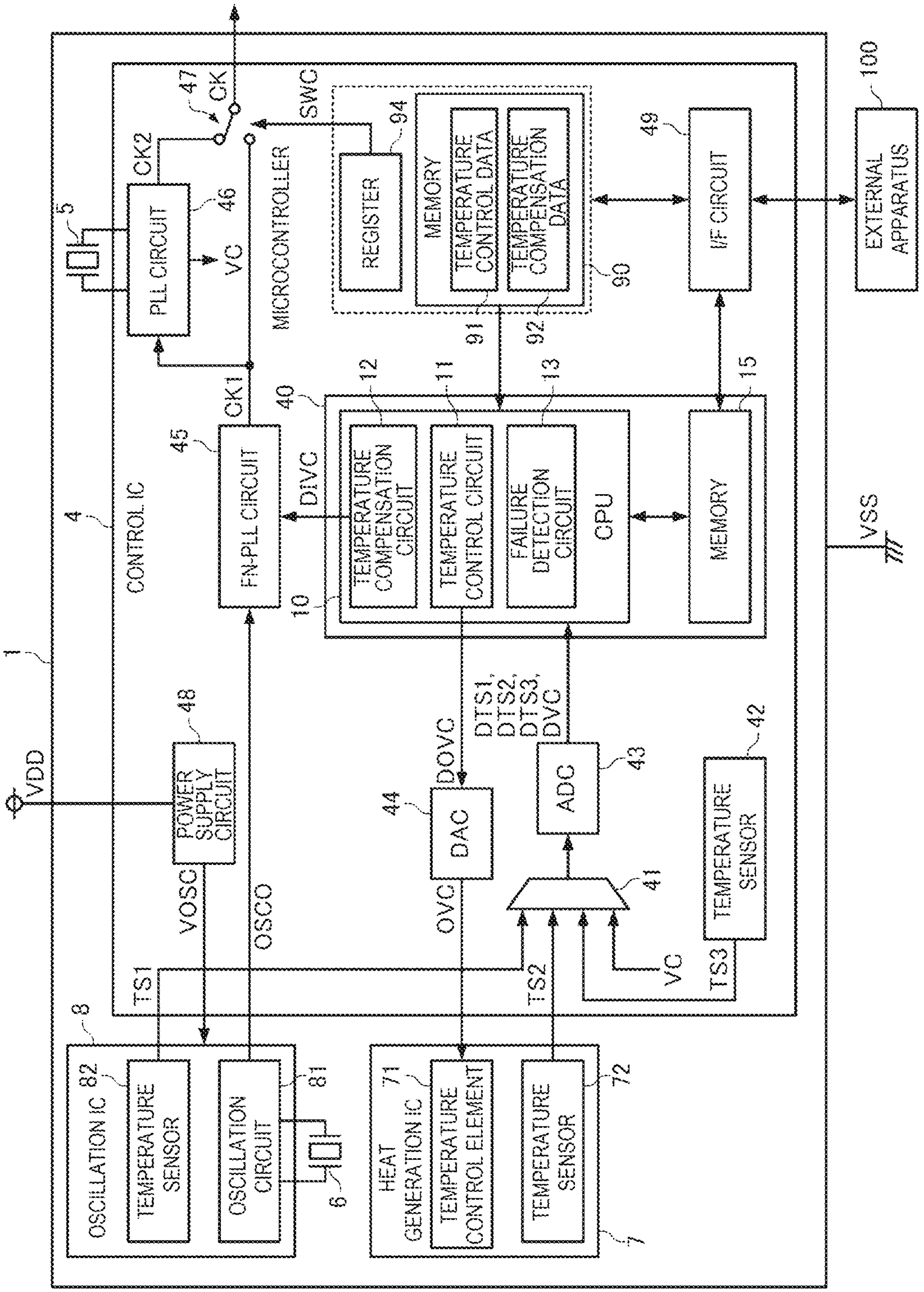

FIG. 5
1
VDD
4
CONTROL IC
48
POWER SUPPLY CIRCUIT
VOSC
OSCO
45
FN-PLL CIRCUIT
CK1
DIVC
46
PLL CIRCUIT
5
VC
CK2
47
CK
SWC
MICROCONTROLLER
94
REGISTER
MEMORY
TEMPERATURE CONTROL DATA
TEMPERATURE COMPENSATION DATA
90
91
92
49
I/F CIRCUIT
100
EXTERNAL APPARATUS
40
10
12
TEMPERATURE COMPENSATION CIRCUIT
11
TEMPERATURE CONTROL CIRCUIT
13
FAILURE DETECTION CIRCUIT
CPU
15
MEMORY
DTS1, DTS2, DTS3, DVC
DOVC
44
DAC
43
ADC
41
42
TEMPERATURE SENSOR
TS3
VC
TS1
TS2
OVC
VSS
8
OSCILLATION IC
82
TEMPERATURE SENSOR
81
OSCILLATION CIRCUIT
6
7
HEAT GENERATION IC
71
TEMPERATURE CONTROL ELEMENT
72
TEMPERATURE SENSOR

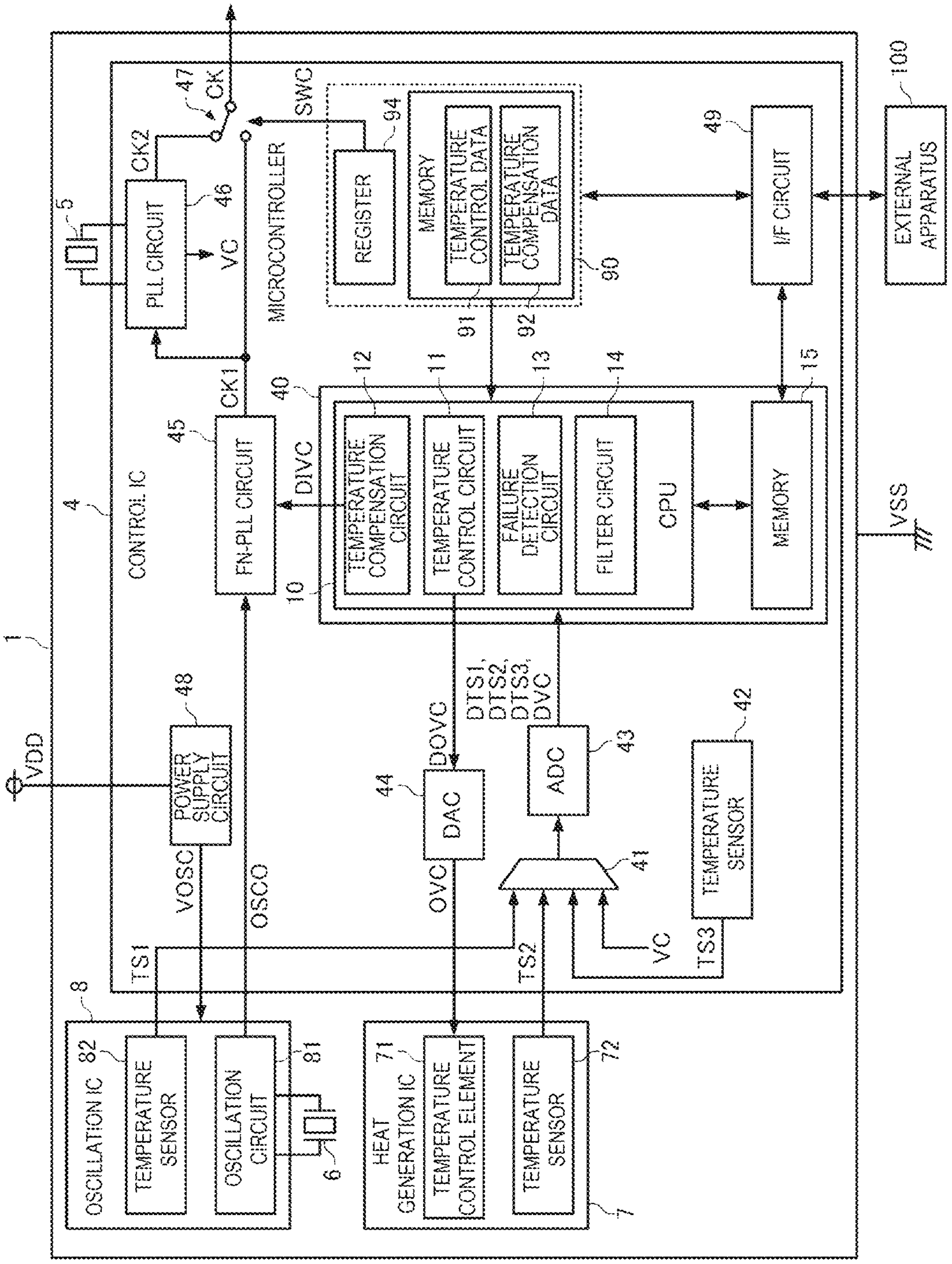

FIG. 12
1
VDD
48
POWER SUPPLY CIRCUIT
4
CONTROL IC
45
FN-PLL CIRCUIT
CK1
DIVC
5
46
PLL CIRCUIT
VC
CK2
47
CK
SWC
MICROCONTROLLER
94
REGISTER
MEMORY
TEMPERATURE CONTROL DATA
TEMPERATURE COMPENSATION DATA
90
91
92
49
I/F CIRCUIT
100
EXTERNAL APPARATUS
40
10
12
TEMPERATURE COMPENSATION CIRCUIT
11
TEMPERATURE CONTROL CIRCUIT
13
FAILURE DETECTION CIRCUIT
14
FILTER CIRCUIT
CPU
15
MEMORY
VSS
DOVC
DTS1, DTS2, DTS3, DVC
44
DAC
43
ADC
41
42
TEMPERATURE SENSOR
VOSC
OSCO
OVC
TS1
TS2
TS3
VC
8
OSCILLATION IC
82
TEMPERATURE SENSOR
81
OSCILLATION CIRCUIT
6
HEAT GENERATION IC
71
TEMPERATURE CONTROL ELEMENT
72
TEMPERATURE SENSOR
7

CIRCUIT APPARATUS AND OSCILLATOR

The present application is based on, and claims priority from JP Application Serial Number 2023-222299, filed Dec. 28, 2023, the disclosure of which is hereby incorporated by reference herein in its entirety.

BACKGROUND

1. Technical Field

The present disclosure relates to a circuit apparatus and an oscillator.

2. Related Art

JP-A-2023-105925 discloses a circuit apparatus that detects a failure of an oscillator in advance based on a change in a threshold voltage of a transistor inside the oscillator.

In the circuit apparatus disclosed in JP-A-2023-105925, it is not possible to predict in advance a failure of a PLL circuit due to aging of a voltage controlled type oscillation circuit.

SUMMARY

An aspect of a circuit apparatus according to the disclosure includes:

- a first oscillation circuit configured to generate a first clock signal;
- a PLL circuit including a second oscillation circuit configured to generate a second clock signal and a frequency control voltage generation circuit configured to generate a frequency control voltage for controlling a frequency of the second clock signal, the PLL circuit being configured to synchronize a phase of the second clock signal with a phase of the first clock signal; and
- a failure detection circuit configured to monitor the frequency control voltage and detect whether there is a possibility that the frequency control voltage deviates from a predetermined voltage range in which the second oscillation circuit is capable of operating normally.

An aspect of an oscillator according to the disclosure includes the aspect of the circuit apparatus.

BRIEF DESCRIPTION OF THE DRAWINGS

FIG. 5 is a functional block diagram of an oscillator in a first embodiment.

FIG. 12 is a functional block diagram of an oscillator in a second embodiment.

DESCRIPTION OF EMBODIMENTS

Hereinafter, preferred embodiments of the disclosure will be described in detail with reference to the drawings. The embodiments to be described below do not unduly limit contents of the disclosure described in the claims. Not all configurations described below are necessarily essential elements of the disclosure.

1. First Embodiment

1-1. Configuration of Oscillator

Figure 1:
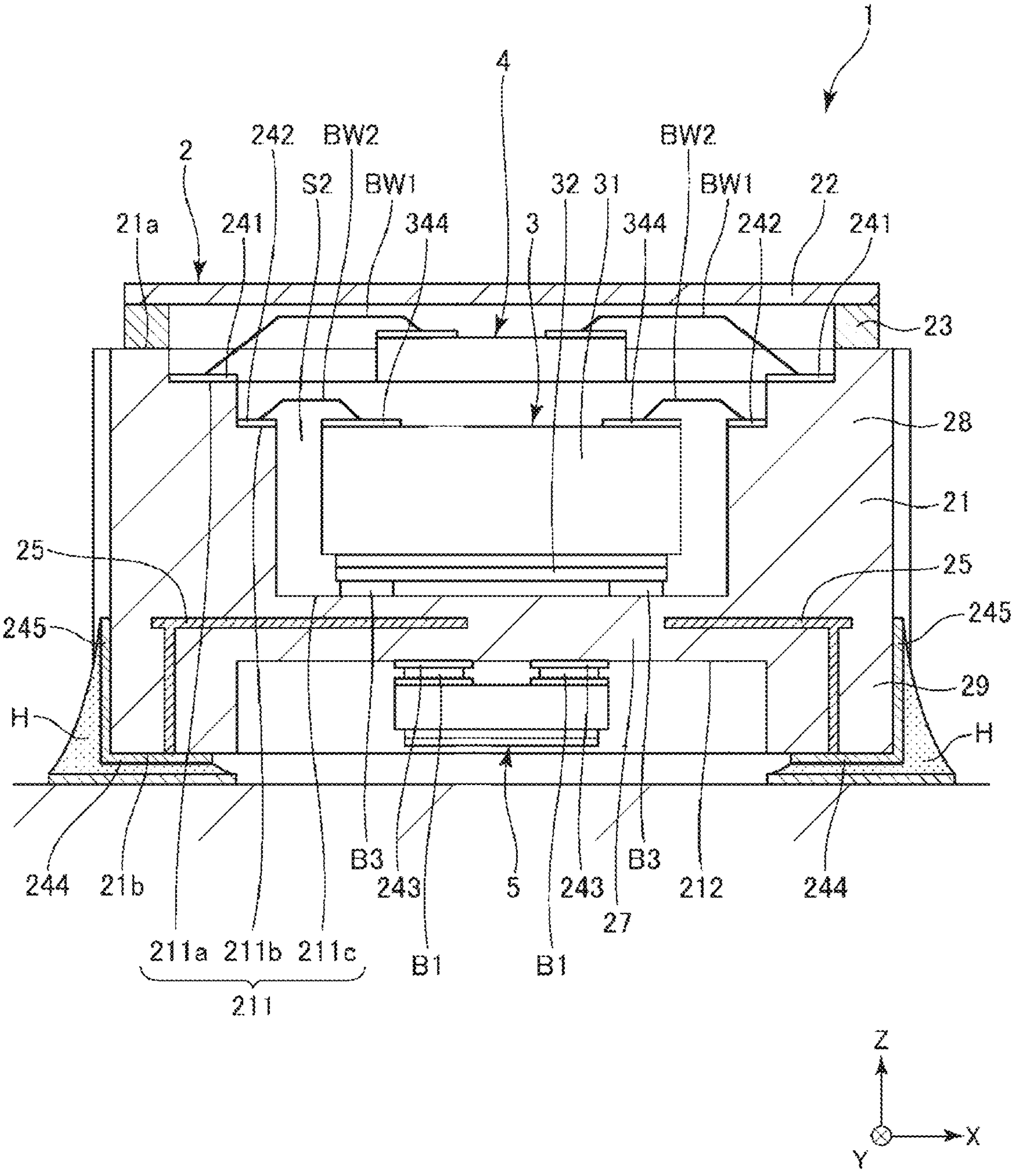
FIG. 1 is a cross-sectional view of an oscillator in an embodiment.
Figure 2:
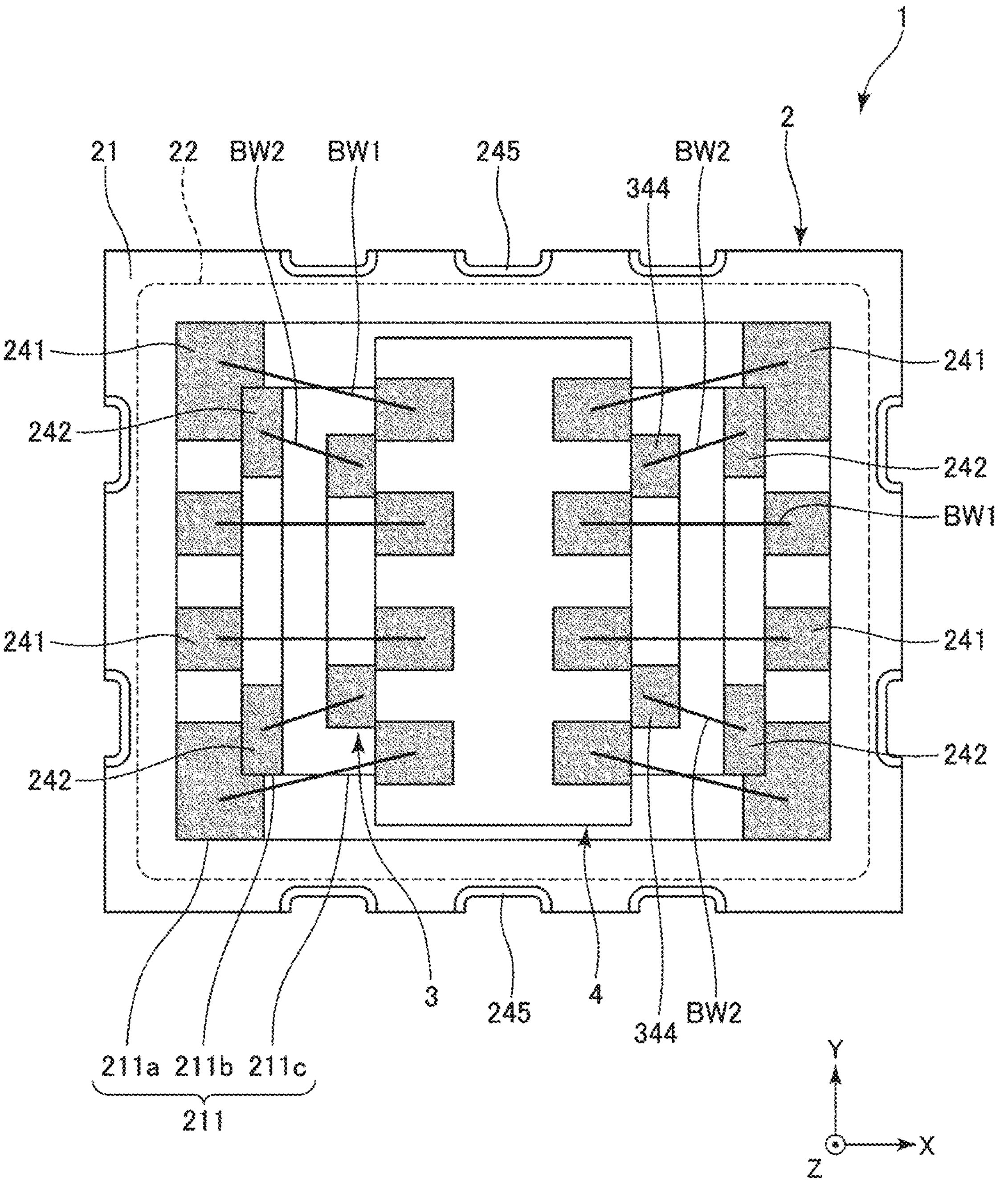
FIG. 2 is a plan view of the oscillator in the embodiment.
Figure 3:
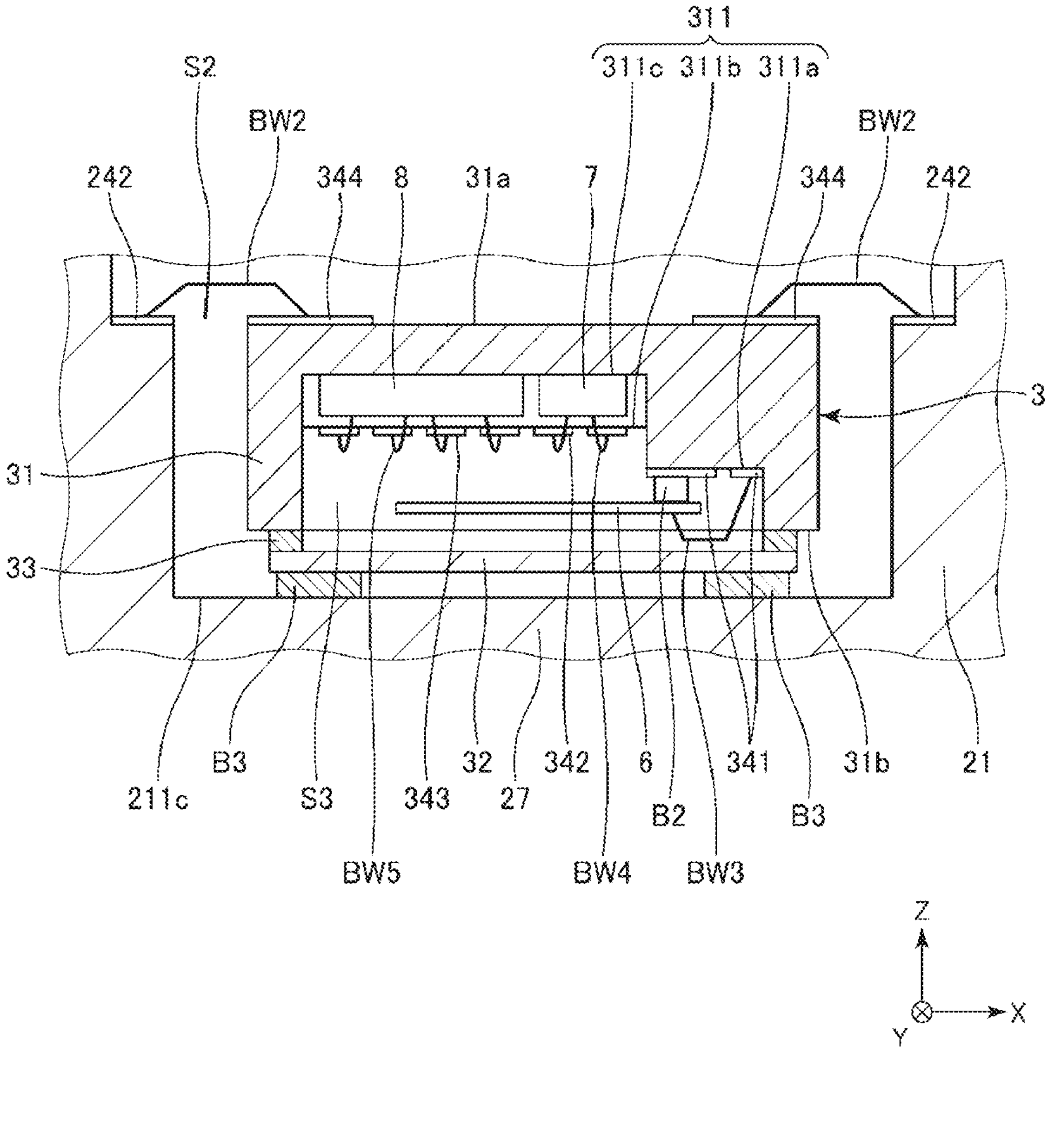
FIG. 3 is a cross-sectional view showing an inner package of the oscillator and the inside thereof.
Figure 4:
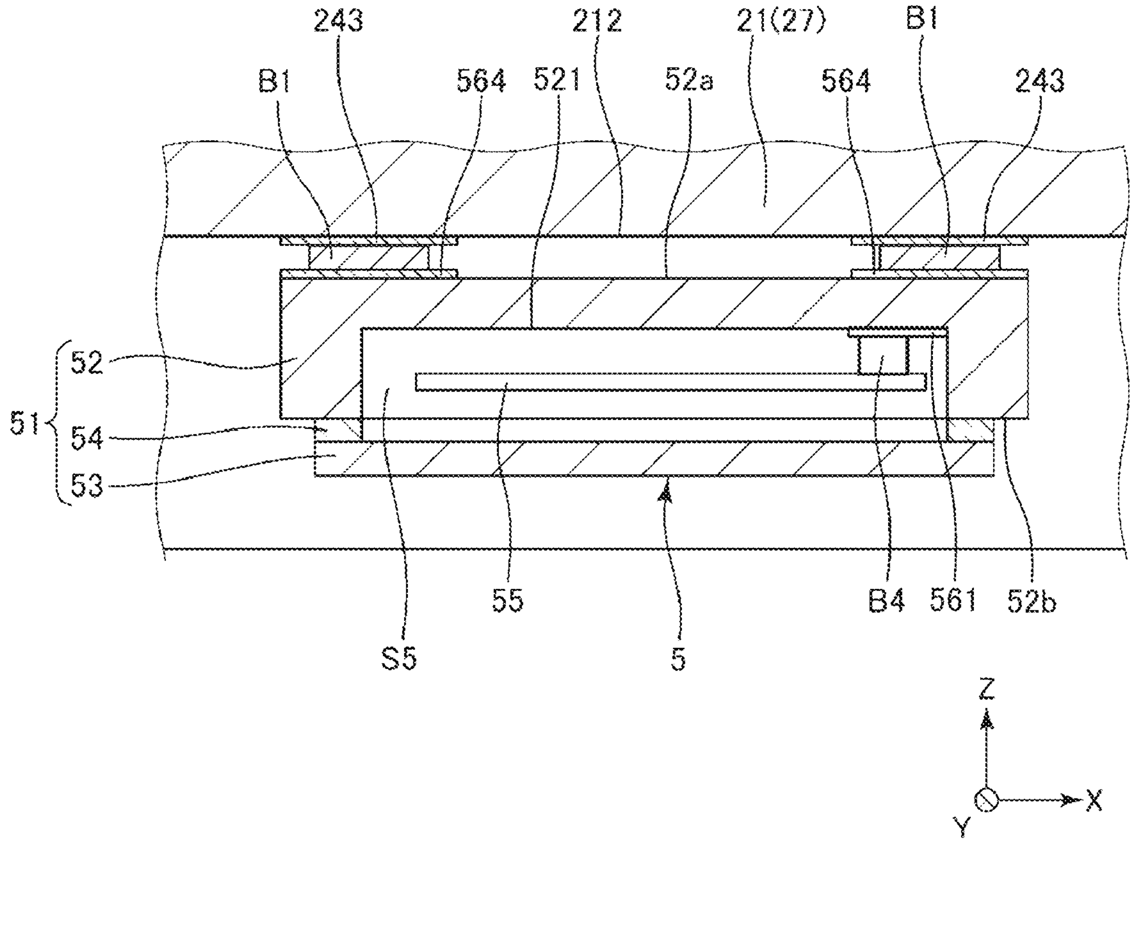
FIG. 4 is a cross-sectional view showing a resonator of the oscillator.

FIG. 1 is a cross-sectional view showing an oscillator in an embodiment. FIG. 2 is a plan view of the oscillator as viewed from above. FIG. 3 is a cross-sectional view showing an inner package of the oscillator and the inside thereof. FIG. 4 is a cross-sectional view showing a resonator of the oscillator.

An oscillator 1 shown in FIGS. 1 and 2 is an oven type quartz crystal oscillator, and includes an outer package 2, an inner package 3, a control IC 4, and a resonator 5. The inner package 3, the control IC 4, and the resonator 5 are accommodated in the outer package 2.

As shown in FIG. 1, the outer package 2 includes an outer base 21 and an outer lid 22. The outer base 21 includes a board 27, a frame-shaped wall portion 28 standing upward from an edge portion of an upper surface of the board 27, and a frame-shaped leg portion 29 standing downward from an edge portion of a lower surface of the board 27. The upper surface of the board 27 and the wall portion 28 form an upper recess 211 that opens in an upper surface 21*a* of the outer base 21, and the lower surface of the board 27 and the leg portion 29 form a lower recess 212 that opens in a lower surface 21*b* of the outer base 21. Therefore, the outer base 21 has a substantially H-shaped cross section.

The upper recess 211 includes a first upper recess 211*a* that opens in the upper surface 21*a*, a second upper recess 211*b* that opens in a bottom surface of the first upper recess 211*a* and has an opening smaller than that of the first upper recess 211*a*, and a third upper recess 211*c* that opens in a bottom surface of the second upper recess 211*b* and has an opening smaller than that of the second upper recess 211*b*. The control IC 4 is disposed at the bottom surface of the first upper recess 211*a*, and the inner package 3 is disposed at a bottom surface of the third upper recess 211*c*.

The outer lid 22 is bonded to the upper surface 21*a* of the outer base 21 via a sealing member 23 such as a seal ring or low-melting-point glass to close the opening of the upper recess 211. Accordingly, the upper recess 211 is hermetically sealed, and an outer accommodation space S2 serving as an accommodation space is formed in the outer package 2. Meanwhile, the opening of the lower recess 212 is not sealed and faces the outside of the outer package 2. The inner package 3 and the control IC 4 are accommodated in the outer accommodation space S2, and the resonator 5 is disposed at the lower recess 212.

The outer base 21 includes a plurality of internal terminals 241 disposed at the bottom surface of the first upper recess 211*a*, a plurality of internal terminals 242 disposed at the bottom surface of the second upper recess 211*b*, a plurality of internal terminals 243 disposed at a bottom surface of the lower recess 212, and a plurality of external terminals 244 disposed at the lower surface 21*b*, that is, a top surface of the leg portion 29. Each internal terminal 241 is electrically coupled to the control IC 4 via a bonding wire BW1, each internal terminal 242 is electrically coupled to the inner package 3 via a bonding wire BW2, and each internal terminal 243 is electrically coupled to the resonator 5 via a conductive bonding member B1.

The respective terminals 241, 242, 243, and 244 are electrically connected as appropriate through internal wiring 25 formed in the outer base 21 to electrically connect the control IC 4, the inner package 3, the resonator 5, and the external terminal 244. The internal wiring 25 is coupled to the external terminal 244 through the inside of the leg portion 29. The external terminal 244 is coupled to an external apparatus (not shown). A side surface terminal 245 coupled to the external terminal 244 is disposed at a side surface of the leg portion 29. The side surface terminal 245 is a castellation. Therefore, solder H spreads over the side surface terminal 245 to form a fillet, and thus mechanical and electrical connection with the external apparatus becomes stronger. However, the configuration is not limited thereto, and for example, the side surface terminal 245 may be omitted.

As shown in FIG. 3, the inner package 3 includes an inner base 31 and an inner lid 32. The inner base 31 has a recess 311 that opens in a lower surface 31*b*.

The recess 311 includes a first recess 311*a* that opens in the lower surface 31*b*, a second recess 311*b* that opens in a bottom surface of the first recess 311*a* and has an opening smaller than that of the first recess 311*a*, and a third recess 311*c* that opens in a bottom surface of the second recess 311*b* and has an opening smaller than that of the second recess 311*b*. A resonator element 6 is disposed at the bottom surface of the first recess 311*a*, and a heat generation IC 7 and an oscillation IC 8 are disposed side by side in an X-axis direction at a bottom surface of the third recess 311*c*.

The inner lid 32 is bonded to the lower surface 31*b* of the inner base 31 via a sealing member 33 such as a seal ring or low-melting-point glass to close the opening of the recess 311. Accordingly, the recess 311 is hermetically sealed, and an inner accommodation space S3 is formed in the inner package 3. The resonator element 6, the heat generation IC 7, and the oscillation IC 8 are accommodated in the inner accommodation space S3.

Such an inner accommodation space S3 is airtight and in a reduced pressure state, and is preferably in a state closer to vacuum. Accordingly, viscous resistance in the inner accommodation space S3 is reduced, and a vibrational characteristic of the resonator element 6 is improved. However, an atmosphere in the inner accommodation space S3 is not particularly limited.

The inner base 31 includes a plurality of internal terminals 341 disposed at the bottom surface of the first recess 311*a*, a plurality of internal terminals 342 and 343 disposed at the bottom surface of the second recess 311*b*, and a plurality of external terminals 344 disposed at an upper surface 31*a* of the inner base 31. Each internal terminal 341 is electrically coupled to the resonator element 6 via a conductive bonding member B2 and a bonding wire BW3, each internal terminal 342 is electrically coupled to the heat generation IC 7 via a bonding wire BW4, and each internal terminal 343 is electrically coupled to the oscillation IC 8 via a bonding wire BW5.

The terminals 341, 342, 343, and 344 are electrically connected as appropriate through internal wiring (not shown) formed in the inner package 3 to electrically connect the resonator element 6, the heat generation IC 7, the oscillation IC 8, and the external terminal 344. The inside and the outside of such an inner package 3 are electrically connected via the external terminal 344.

The inner package 3 as described above is fixed to the bottom surface of the third upper recess 211*c* via a bonding member B3 having sufficiently low thermal conductivity at the inner lid 32.

As shown in FIG. 3, the heat generation IC 7 is disposed at the bottom surface of the third recess 311*c* with an active surface facing downward (toward the inner lid 32) and is electrically coupled to the plurality of internal terminals 342 via the bonding wire BW4. The oscillation IC 8 is disposed at the bottom surface of the third recess 311*c* with an active surface facing downward (toward the inner lid 32) and is electrically coupled to the plurality of internal terminals 343 via the bonding wire BW5.

As shown in FIG. 4, the resonator 5 includes a package 51 and a resonator element 55 accommodated in the package 51.

The package 51 includes a base 52 and a lid 53. The base 52 has a recess 521 that opens in a lower surface 52*b*. The resonator element 55 is disposed at a bottom surface of the recess 521.

The lid 53 is bonded to the lower surface 52*b* of the base 52 via a sealing member 54 such as a seal ring or low-melting-point glass to close the opening of the recess 521. Accordingly, the recess 521 is hermetically sealed, and an accommodation space S5 is formed in the package 51. The resonator element 55 is accommodated in the accommodation space S5. The accommodation space S5 is airtight and in a depressurized state, and is preferably in a state closer to vacuum. Accordingly, viscous resistance in the accommodation space S5 is reduced, and a vibrational characteristic of the resonator element 55 is improved. However, an atmosphere in the accommodation space S5 is not particularly limited.

The base 52 includes a plurality of internal terminals 561 disposed at the bottom surface of the recess 521 and a plurality of external terminals 564 disposed at an upper surface 52*a* of the base 52. Each internal terminal 561 is electrically coupled to the resonator element 55 via a conductive bonding member B4. The terminals 561 and 564 are electrically connected as appropriate through internal wiring (not shown) formed in the base 52 to electrically connect the resonator element 55 and the external terminal 564. The inside and the outside of such a package 51 are electrically connected via the external terminal 564.

The resonator element 55 is an AT cut quartz crystal resonator element. Alternatively, the resonator element 55 may not be the AT cut quartz crystal resonator element, and may be, for example, an SC cut quartz crystal resonator element, a BT cut quartz crystal resonator element, a tuning fork type quartz crystal resonator element, a surface acoustic wave resonator, another piezoelectric resonator element, or a MEMS resonator element.

As shown in FIG. 4, the resonator 5 is fixed to the bottom surface of the lower recess 212 via the conductive bonding member B1. The external terminal 564 and the internal terminal 243 are electrically connected via the bonding member B1.

1-2. Functional Configuration of Oscillator

FIG. 5 is a functional block diagram of the oscillator 1 in a first embodiment. In FIG. 5, the same components as those in FIGS. 1 to 4 are denoted by the same reference signs. As shown in FIG. 5, the oscillator 1 in the first embodiment includes the control IC 4, the resonator 5, the resonator element 6, the heat generation IC 7, and the oscillation IC 8.

The oscillation IC 8 includes an oscillation circuit 81 and a temperature sensor 82, and operates by being supplied with a power supply voltage VOSC from the control IC 4. The oscillation circuit 81 is electrically coupled to both ends of the resonator element 6, amplifies an output signal of the resonator element 6 and feeds back the amplified output signal to the resonator element 6, thereby causing the resonator element 6 to oscillate and outputting an oscillation signal OSCO. For example, the oscillation circuit 81 may be an oscillation circuit using an inverter as an amplification element or may be an oscillation circuit using a bipolar transistor as the amplification element. The oscillation signal OSCO output from the oscillation circuit 81 is received by the control IC 4.

The temperature sensor 82 is a temperature sensing element that detects a temperature and outputs a temperature detection signal TS1 having a voltage level corresponding to the detected temperature. The temperature sensor 82 is built in the oscillation IC 8 to detect a temperature of the oscillation IC 8. The temperature detection signal TS1 output from the temperature sensor 82 is received by the control IC 4. The temperature sensor 82 may be, for example, a sensor utilizing temperature dependence of a forward voltage of a PN junction of a diode.

The heat generation IC 7 includes a temperature control element 71 and a temperature sensor 72. The temperature control element 71 is an element that controls a temperature of the resonator element 6 based on a temperature control signal OVC output from the control IC 4, and may be a heat generation element. For example, the temperature control element 71 is a CMOS transistor, and an amount of generated heat changes according to a voltage of the temperature control signal OVC received by a gate. As the amount of heat generated by the temperature control element 71 increases, the temperature of the resonator element 6 increases, and the amount of heat generated by the temperature control element 71 is controlled by the control IC 4 such that the temperature of the resonator element 6 is constant at a target set temperature. For example, the set temperature may be a fixed value such as 80° C., or may be set as desired within a predetermined range such as a range of 70° C. or higher and 125° C. or lower.

The temperature sensor 72 is a temperature sensing element that detects a temperature and outputs a temperature detection signal TS2 having a voltage level corresponding to the detected temperature. The temperature sensor 72 is built in the heat generation IC 7 to detect a temperature of the heat generation IC 7. Since the temperature control element 71 is also built in the heat generation IC 7, the temperature sensor 72 detects a temperature of the temperature control element 71. The temperature detection signal TS2 output from the temperature sensor 72 is received by the control IC 4. The temperature sensor 72 may be, for example, a sensor utilizing temperature dependence of a forward voltage of a PN junction of a diode.

As shown in FIG. 3, the resonator element 6, the heat generation IC 7, and the oscillation IC 8 are accommodated in the inner package 3, and heat generation of the heat generation IC 7 is controlled by the control IC 4 such that the temperature of the resonator element 6 is constant. The heat generation IC 7 is a heat source, radiant heat from the heat generation IC 7 is transmitted to the resonator element 6 and the oscillation IC 8, and thus a difference occurs between the temperature of the resonator element 6 and the oscillation IC 8 and the temperature of the heat generation IC 7. Meanwhile, the resonator element 6 and the oscillation IC 8 are disposed apart from the heat generation IC 7, and assuming that a thermal distance between the heat generation IC 7 and the resonator element 6 is substantially the same as a thermal distance between the heat generation IC 7 and the oscillation IC 8, it can be said that the temperature of the oscillation IC 8 is close to the temperature of the resonator element 6. That is, the temperature detected by the temperature sensor 82 built in the oscillation IC 8 is closer to the temperature of the resonator element 6 than the temperature detected by the temperature sensor 72 built in the heat generation IC 7. Therefore, as will be described later, the control IC 4 controls heat generation of the heat generation IC 7 based on the temperature detection signal TS1 output from the temperature sensor 82. However, depending on an arrangement of the resonator element 6, the heat generation IC 7, and the oscillation IC 8, the temperature of the heat generation IC 7 may be closer to the temperature of the resonator element 6 than the temperature of the oscillation IC 8, and in this case, the control IC 4 may control the heat generation of the heat generation IC 7 based on the temperature detection signal TS2 output from the temperature sensor 72.

The control IC 4 includes a microcontroller 40, a selector 41, a temperature sensor 42, an A/D conversion circuit 43, a D/A conversion circuit 44, a fractional-N PLL circuit 45, a PLL circuit 46, a switch circuit 47, a power supply circuit 48, an interface circuit 49, a memory 90, and a register 94. The PLL is an abbreviation for phase locked loop.

The power supply circuit 48 generates, based on a power supply voltage VDD supplied from the outside of the oscillator 1 and a ground voltage VSS, the power supply voltage VOSC that is a constant voltage lower than the power supply voltage VDD. For example, the power supply circuit 48 generates the power supply voltage VOSC that is a constant voltage based on an output voltage of a bandgap reference circuit. The power supply voltage VOSC is supplied to the oscillation IC 8.

The fractional-N PLL circuit 45 receives the oscillation signal OSCO output from the oscillation IC 8, and generates and outputs a clock signal CK1 obtained by converting a frequency $f_{OSCO}$ of the oscillation signal OSCO into a frequency $f_{CK1}$ corresponding to a division ratio indicated by a division ratio control signal DIVC.

Figure 6:
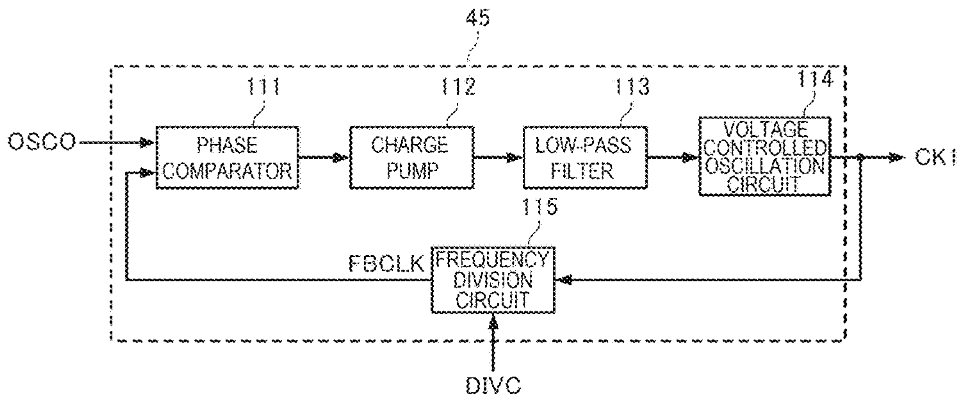
FIG. 6 shows a configuration example of a fractional-N PLL circuit.

FIG. 6 shows a configuration example of the fractional-N PLL circuit 45. As shown in FIG. 6, the fractional-N PLL circuit 45 includes a phase comparator 111, a charge pump 112, a low-pass filter 113, a voltage controlled oscillation circuit 114, and a frequency division circuit 115.

The phase comparator 111 compares a phase of the oscillation signal OSCO with a phase of a clock signal FBCLK output from the frequency division circuit 115, and outputs a comparison result as a pulse voltage.

The charge pump 112 converts the pulse voltage output from the phase comparator 111 into a current. The low-pass filter 113 smooths the current output from the charge pump 112 and converts the smoothed current into a voltage.

The voltage controlled oscillation circuit 114 uses the output voltage of the low-pass filter 113 as a frequency control voltage, and outputs the clock signal CK1 whose frequency changes according to the frequency control voltage. The voltage controlled oscillation circuit 114 can be implemented as various types of oscillation circuits such as an LC oscillation circuit implemented using an inductance element such as a coil and a capacitance element such as a capacitor and an oscillation circuit using a piezoelectric resonator such as a quartz crystal resonator.

The frequency division circuit 115 outputs, using a value of the frequency division ratio control signal DIVC as the frequency division ratio, the clock signal FBCLK obtained by frequency-dividing the clock signal CK1 output from the voltage controlled oscillation circuit 114.

The fractional-N PLL circuit 45 implemented as described above generates the clock signal CK1 by performing feedback control such that the phase of the oscillation signal OSCO matches a phase of the signal obtained by frequency-dividing the clock signal CK1 using the division ratio specified by the division ratio control signal DIVC. The division ratio control signal DIVC is delta-sigma modulated, the division ratio specified by the division ratio control signal DIVC is switched among a plurality of integer division ratios, and becomes a fractional division ratio when being averaged. Therefore, the frequency $f_{CK1}$ is a non-integer multiple of the frequency $f_{OSCO}$. The fractional-N PLL circuit 45 may output, according to the division ratio control signal DIVC, the clock signal CK1 having the frequency $f_{CK1}$ that is different from the frequency $f_{OSCO}$ and is substantially constant regardless of an outside air temperature.

Returning to description of FIG. 5, the PLL circuit 46 receives the clock signal CK1 output from the fractional-N PLL circuit 45, and generates and outputs a clock signal CK2 having a frequency $f_{CK2}$ that is the same frequency as the frequency $f_{CK1}$ of the clock signal CK1.

Figure 7:
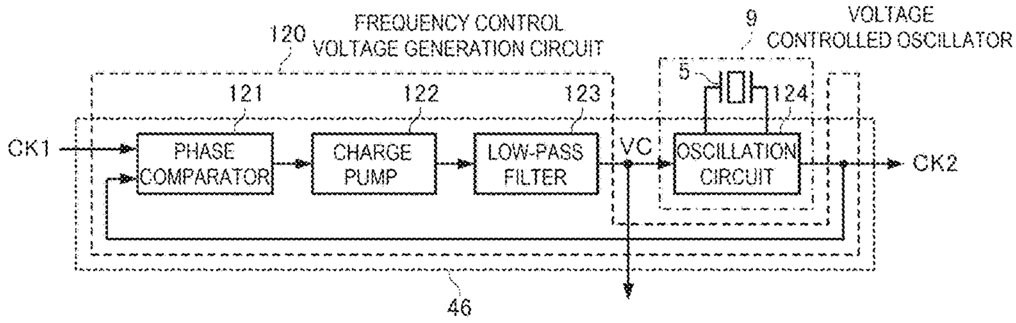
FIG. 7 shows a configuration example of a PLL circuit.

FIG. 7 shows a configuration example of the PLL circuit 46. As shown in FIG. 7, the PLL circuit 46 includes a phase comparator 121, a charge pump 122, a low-pass filter 123, and an oscillation circuit 124.

The phase comparator 121 compares a phase of the clock signal CK1 with a phase of the clock signal CK2 output from the oscillation circuit 124, and outputs a comparison result as a pulse voltage.

The charge pump 122 converts the pulse voltage output from the phase comparator 121 into a current. The low-pass filter 123 smooths the current output from the charge pump 122 and converts the smoothed current into a voltage.

The oscillation circuit 124 uses the output voltage of the low-pass filter 123 as a frequency control voltage VC, and outputs the clock signal CK2 whose frequency $f_{CK2}$ changes according to the frequency control voltage VC. Specifically, the oscillation circuit 124 is coupled to the resonator 5 and causes the resonator 5 to oscillate to generate the clock signal CK2 having the frequency $f_{CK2}$ corresponding to the frequency control voltage VC.

In this way, the resonator 5 and the oscillation circuit 124 constitute a voltage controlled oscillator 9 whose oscillation frequency changes according to the frequency control voltage VC. The phase comparator 121, the charge pump 122, and the low-pass filter 123 constitute a frequency control voltage generation circuit 120 that receives the clock signal CK1 and generates the frequency control voltage VC for controlling the frequency $f_{CK2}$ of the clock signal CK2.

The PLL circuit 46 implemented as described above receives the clock signal CK1 output from the fractional-N PLL circuit 45 and synchronizes the phase of the clock signal CK2 with that of the clock signal CK1. That is, the PLL circuit 46 generates and outputs the clock signal CK2 having the frequency $f_{CK2}$ that is the same frequency as the frequency $f_{CK1}$ of the clock signal CK1 by performing feedback control on the frequency control voltage VC such that the phase of the clock signal CK1 matches the phase of the clock signal CK2.

Returning to description of FIG. 5, the frequency $f_{CK1}$ of the clock signal CK1 output from the fractional-N PLL circuit 45 is a non-integer multiple of the frequency $f_{OSCO}$ of the oscillation signal OSCO and has large jitter. In contrast, the frequency $f_{CK2}$ of the clock signal CK2 output from the PLL circuit 46 is the same as the frequency $f_{CK1}$ of the clock signal CK1, and has smaller jitter than that of the clock signal CK1 since the clock signal CK2 is generated by oscillation of the resonator 5 having high frequency stability.

The switch circuit 47 outputs a clock signal CK obtained by selecting the clock signal CK1 or the clock signal CK2 according to a logic level of a switch control signal SWC output from the register 94. The clock signal CK is output to the outside of the oscillator 1. The clock signal CK may be supplied to an external apparatus 100 or may be supplied to an apparatus different from the external apparatus 100. For example, the clock signal CK2 with small jitter may be selected as the clock signal CK during a normal operation of the oscillator 1, and the clock signal CK1 may be selected as the clock signal CK during a test of the clock signal CK1.

The temperature sensor 42 is a temperature sensing element that detects a temperature and outputs a temperature detection signal TS3 having a voltage level corresponding to the detected temperature. The temperature sensor 42 is built in the control IC 4 to detect a temperature of the control IC 4. As shown in FIG. 1, the control IC 4 is disposed at a place close to the outer lid 22, a distance between the resonator element 6 and the temperature sensor 42 is larger than a distance between the resonator element 6 and the temperature sensor 82 provided in the oscillation IC 8, and the temperature of the control IC 4 is easily affected by a temperature of outside air of the oscillator 1. Therefore, when an amount of heat generated by the control IC 4 is substantially constant, the temperature sensor 42 can detect a change in the temperature of the outside air of the oscillator 1. The temperature detection signal TS3 output from the temperature sensor 42 is received by the control IC 4. The temperature sensor 42 may be, for example, a sensor utilizing temperature dependence of a forward voltage of a PN junction of a diode.

The selector 41 selects and outputs any one of the temperature detection signal TS1 output from the oscillation IC 8, the temperature detection signal TS2 output from the heat generation IC 7, the temperature detection signal TS3 output from the temperature sensor 42, and the frequency control voltage VC output from the PLL circuit 46. In the embodiment, the selector 41 selects the temperature detection signals TS1, TS2, TS3, and the frequency control voltage VC in a time-division manner and periodically outputs the selected signals.

The A/D conversion circuit 43 converts voltages of the temperature detection signals TS1, TS2, TS3, and the frequency control voltage VC, which are analog signals output from the selector 41 in a time-division manner, into temperature codes DTS1, DTS2, DTS3, and a frequency control code DVC, which are digital signals, respectively. The A/D conversion circuit 43 may convert the temperature detection signals TS1, TS2, TS3, and the frequency control voltage VC into the temperature codes DTS1, DTS2, DTS3, and the frequency control code DVC after converting voltage levels using a resistor divider or the like.

The microcontroller 40 includes a CPU 10 and a memory 15. The CPU is an abbreviation for a central processing unit. Temperature control data 91 and temperature compensation data 92 are stored in the non-volatile memory 90 and are transferred to the memory 15 when the oscillator 1 is started up. A temperature control program, a temperature compensation program, and a failure detection program (not shown)

are stored in the non-volatile memory 90 and are transferred to the memory 15 when the oscillator 1 is started up.

The CPU 10 functions as a temperature control circuit 11 by executing the temperature control program transferred to the memory 15. The temperature control circuit 11 controls an operation of the temperature control element 71 built in the heat generation IC 7. Specifically, the temperature control circuit 11 outputs, based on the temperature code DTS1 and the temperature control data 91 transferred to the memory 15 and stored therein, a temperature control code DOVC for controlling the amount of heat generated by the temperature control element 71. For example, the temperature control data 91 may include information on the target set temperature for the temperature of the resonator element 6 and gain information for controlling the amount of heat generated by the temperature control element 71. Alternatively, when the target set temperature for the temperature of the resonator element 6 varies depending on the outside air temperature, the temperature control data 91 may include information indicating a relationship between the temperature code DTS3 and the set temperature. In this case, the temperature control circuit 11 outputs the temperature control code DOVC based on the temperature codes DTS1, DTS3, and the temperature control data 91.

The CPU 10 functions as a temperature compensation circuit 12 by executing the temperature compensation program transferred to the memory 15. The temperature compensation circuit 12 performs temperature compensation for the frequency of the oscillation signal OSCO generated when the oscillation circuit 81 built in the oscillation IC 8 causes the resonator element 6 to oscillate. Specifically, the temperature compensation circuit 12 outputs, based on the temperature code DTS3 and the temperature compensation data 92 transferred to the memory 15, the division ratio control signal DIVC for causing the fractional-N PLL circuit 45 to output the clock signal CK1 whose frequency is constant regardless of the temperature. For example, the temperature compensation data 92 may be table information indicating a relationship between the temperature code DTS3 and the frequency of the oscillation signal OSCO, or may be information on a coefficient value for each order in a mathematical formula indicating the relationship. Alternatively, the temperature compensation data 92 may be information indicating a relationship between the temperature code DTS3 and a value of a fractional division ratio of the fractional-N PLL circuit 45 calculated based on the relationship between the temperature code DTS3 and the frequency of the oscillation signal OSCO.

The CPU 10 functions as a failure detection circuit 13 by executing the failure detection program transferred to the memory 15. The failure detection circuit 13 monitors the frequency control voltage VC and detects whether there is a possibility that the frequency control voltage VC deviates from a predetermined voltage range in which the oscillation circuit 124 is capable of operating normally. Details of processing of the failure detection circuit 13 will be described later.

The D/A conversion circuit 44 converts the temperature control code DOVC, which is a digital signal output from the temperature control circuit 11, into the temperature control signal OVC, which is an analog signal. The temperature control signal OVC is supplied to the temperature control element 71 of the heat generation IC 7.

The interface circuit 49 is a circuit for performing data communication with the external apparatus 100 coupled to the oscillator 1. Specifically, the interface circuit 49 writes or reads data to or from the memory 90, the register 94, or the memory 15 of the microcontroller 40 in response to a request from the external apparatus 100. The interface circuit 49 may be, for example, an interface circuit corresponding to an $I^2C$ bus or an interface circuit corresponding to an SPI bus. The $I^2C$ is an abbreviation for an inter-integrated circuit. The SPI is an abbreviation for a serial peripheral interface.

In an inspection step at the time of manufacturing the oscillator 1, an inspection apparatus that is the external apparatus 100 may set the switch control signal SWC for causing the switch circuit 47 to select the clock signal CK1 via the interface circuit 49 and inspect the clock signal CK1. The inspection apparatus that is the external apparatus 100 writes the temperature control data 91 and the temperature compensation data 92, and further writes the temperature control program and the temperature compensation program to the memory 90 via the interface circuit 49. The temperature control data 91 and the temperature compensation data 92 may be set in the register 94 by the external apparatus 100 when the oscillator 1 is started up.

1-3. Processing of Failure Detection Circuit

Figure 8:
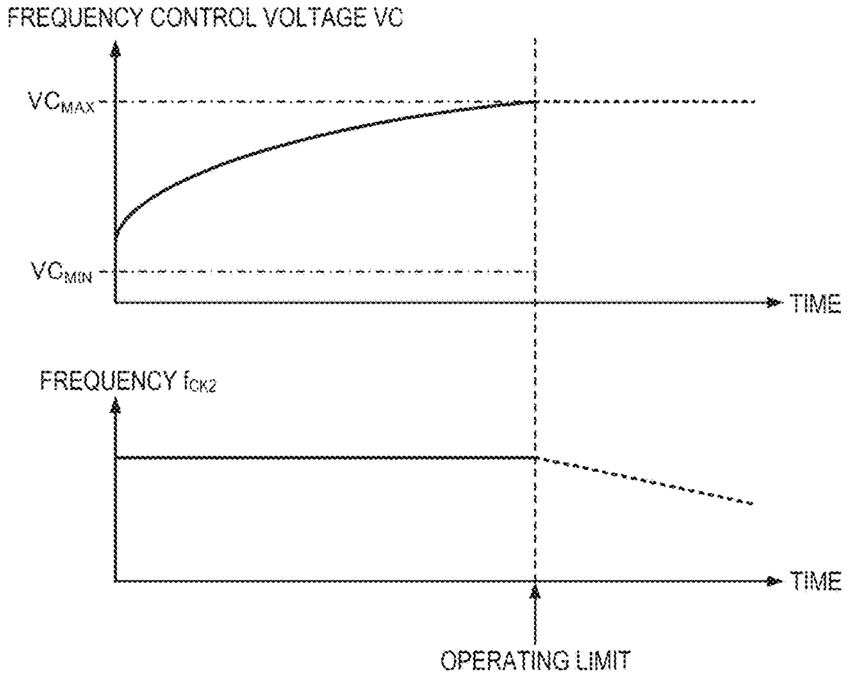
FIG. 8 shows an example of changes over time in a frequency control voltage VC and a frequency $f_{CK2}$.

As shown in FIG. 8, in order to maintain the frequency $f_{CK2}$ of the clock signal CK2 constant by correcting a decrease in the frequency $f_{CK1}$ of the clock signal CK1 and a decrease in the oscillation frequency of the voltage controlled oscillator 9 due to aging, the frequency control voltage VC rises along with a lapse of time. Since the frequency control voltage VC includes an upper limit voltage $VC_{MAX}$ and a lower limit voltage $VC_{MIN}$, when the frequency control voltage VC rises and reaches the upper limit voltage $VC_{MAX}$ along with the lapse of time, an operating limit of the oscillation circuit 124 is reached, and thereafter, the frequency $f_{CK2}$ of the clock signal CK2 decreases along with the lapse of time.

Figure 9:
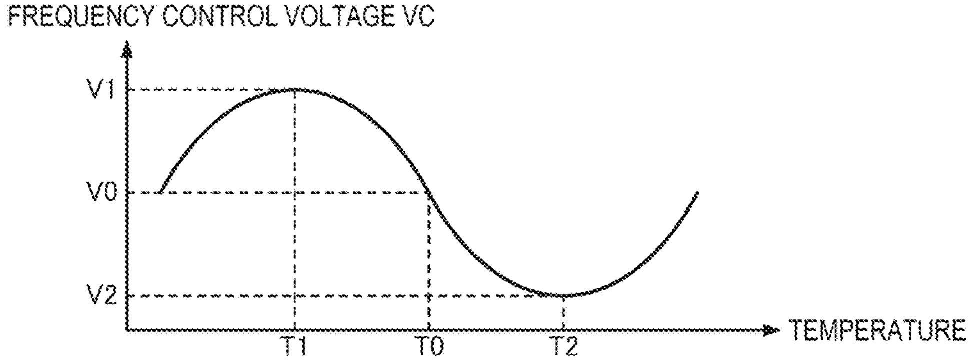
FIG. 9 shows an example of a temperature characteristic of the frequency control voltage VC.

Meanwhile, since the voltage controlled oscillator 9 has a temperature characteristic, the oscillation frequency thereof changes according to a temperature. Therefore, as shown in FIG. 9, in order to maintain the frequency $f_{CK2}$ of the clock signal CK2 constant even when the temperature changes in a predetermined temperature range, the PLL circuit 46 sets the frequency control voltage VC at a reference temperature T0 such as 25° C. to V0 and changes the frequency control voltage VC according to the temperature in order to counteract the temperature characteristic of the voltage controlled oscillator 9. In the example in FIG. 9, the frequency control voltage VC reaches a maximum voltage V1 at a temperature T1, reaches a minimum voltage V2 at a temperature T2, and varies between the maximum voltage V1 and the minimum voltage V2 according to the temperature. The temperature characteristic of the voltage controlled oscillator 9 is measured before shipment of the oscillator 1, and data about the temperature characteristic is stored in the memory 90.

Therefore, even before the frequency control voltage VC rises and reaches the upper limit voltage $VC_{MAX}$ along with the lapse of time, the frequency $f_{CK2}$ of the clock signal CK2 cannot be maintained constant unless the frequency control voltage VC is set to a voltage higher than the upper limit voltage $VC_{MAX}$ at a predetermined temperature, and the oscillation circuit 124 may not be capable of operating normally. That is, when the temperature change is not considered, as shown in FIG. 8, the operating limit of the oscillation circuit 124 is reached when the frequency control voltage VC reaches the upper limit voltage $VC_{MAX}$, and actually, when the frequency control voltage VC reaches an upper limit of a predetermined voltage range considering the temperature change in the predetermined temperature range, the operating limit of the oscillation circuit 124 is reached. Therefore, the failure detection circuit 13 monitors the frequency control voltage VC and detects whether there is a possibility that the frequency control voltage VC deviates from the predetermined voltage range in which the oscillation circuit 124 is capable of operating normally. The failure detection circuit 13 generates a detection flag indicating whether there is a possibility that the frequency control voltage VC deviates from the predetermined voltage range in which the oscillation circuit 124 is capable of operating normally, and stores the detection flag in the register 94. The external apparatus 100 may read the detection flag stored in the register 94 and notify a user when there is a possibility that the frequency control voltage VC deviates from the predetermined voltage range in which the oscillation circuit 124 is capable of operating normally.

Figure 10:
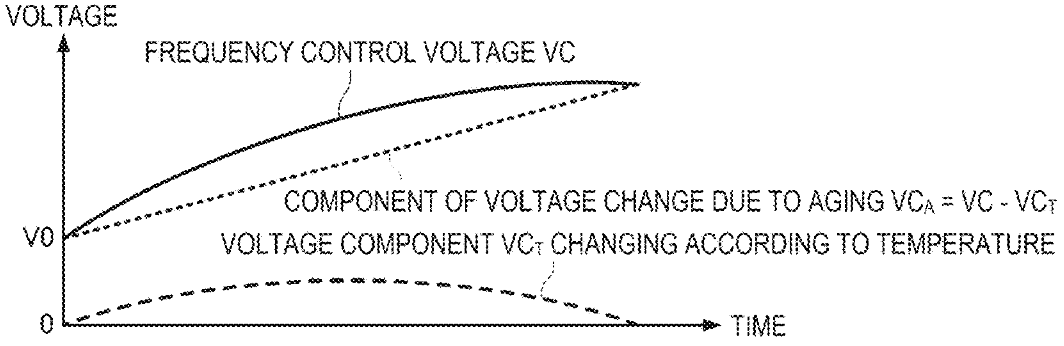
FIG. 10 shows an example of a voltage component $VC_T$ that changes according to a temperature and a voltage component $VC_A$ due to aging in the frequency control voltage VC.

Here, the frequency control voltage VC is a sum of a voltage component $VC_T$ that changes according to the temperature and a voltage component $VC_A$ due to aging. Therefore, as shown in FIG. 10, by subtracting the voltage component $VC_T$ that changes according to the temperature from the frequency control voltage VC, the voltage component $VC_A$ due to aging when the temperature is the reference temperature T0 is obtained. Based on a change in the voltage component $VC_A$ due to aging, an operating limit timing of the oscillation circuit 124 can be predicted.

Figure 11:
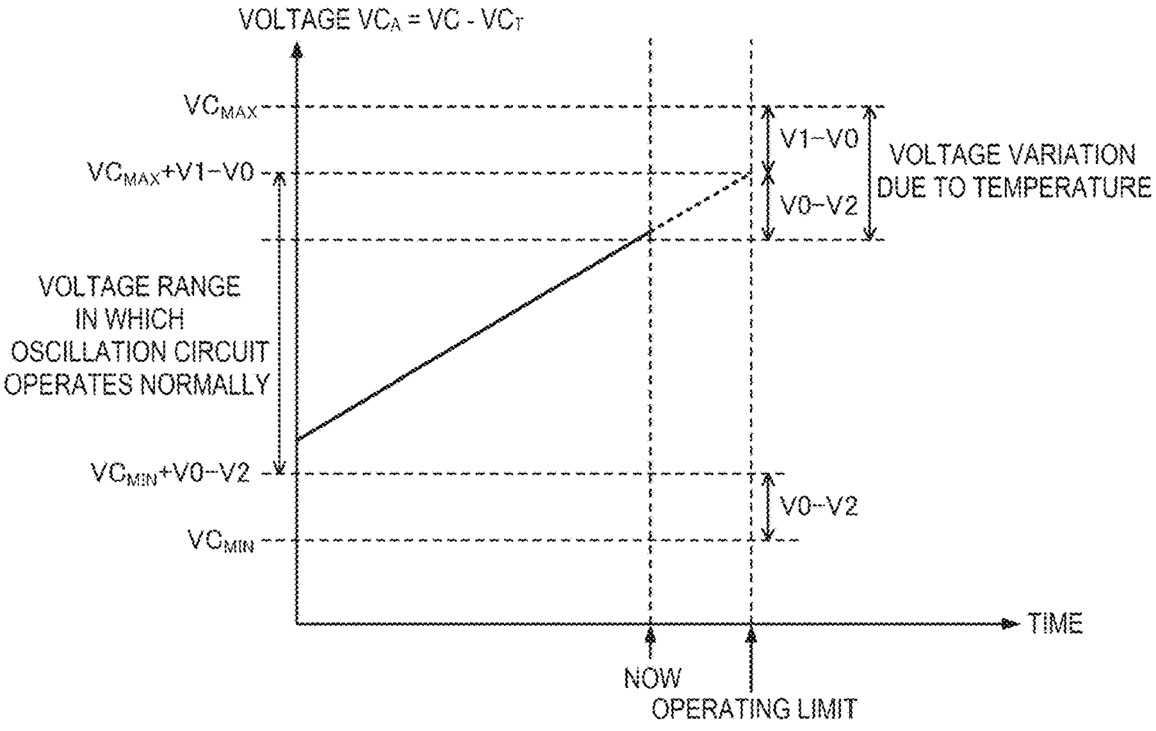
FIG. 11 shows an example of a relationship between a change in the voltage component $VC_A$ due to aging and an operating limit timing of an oscillation circuit.

FIG. 11 shows an example of a relationship between the change in the voltage component $VC_A$ due to aging and the operating limit timing of the oscillation circuit 124. In the example in FIG. 11, the voltage component $VC_A$ due to aging rises linearly when the temperature is the reference temperature T0 along with the lapse of time until now, and when the voltage component $VC_A$ rises in the same way in the future, a time point when the voltage obtained by adding a voltage V1-V0 to the voltage component $VC_A$ reaches $VC_{MAX}$+V1-V0 is predicted as the operating limit timing of the oscillation circuit 124. $VC_{MAX}$+V1-V0 corresponds to an upper limit of the predetermined voltage range in which the oscillation circuit 124 operates normally when a variation in the frequency control voltage VC due to the temperature is considered. A lower limit of the predetermined voltage range in which the oscillation circuit 124 operates normally is $VC_{MIN}$+V0-V2.

Therefore, the failure detection circuit 13 calculates frequency control voltage data DVCX corresponding to the voltage component $VC_A$ due to aging by removing the voltage component $VC_T$ that changes according to the temperature from the frequency control voltage VC based on the frequency control code DVC that is an A/D conversion result of the frequency control voltage VC by the A/D conversion circuit 43 and the temperature code DTS3 that is an A/D conversion result of the voltage of the temperature detection signal TS3, which is a temperature detection voltage. Specifically, the failure detection circuit 13 periodically acquires the frequency control code DVC and the temperature detection signal TS3, and calculates a digital code corresponding to the voltage component $VC_T$ in the frequency control voltage VC based on the temperature detection signal TS3 and the data about the temperature characteristic of the voltage controlled oscillator 9 stored in the memory 90. Further, the failure detection circuit 13 subtracts the digital code corresponding to the voltage component $VC_T$ from the frequency control code DVC to calculate the frequency control voltage data DVCX corresponding to the voltage component $VC_A$ due to aging. Then, the failure detection circuit 13 predicts, based on the calculated frequency control voltage data DVCX, a timing when the frequency control voltage VC deviates from the predetermined voltage range. The predetermined voltage range has the upper limit of $VC_{MAX}$+V1-V0 and the lower limit of $VC_{MIN}$+V0-V2. The failure detection circuit 13 stores the predicted timing in the register 94. The external apparatus 100 may read the timing stored in the register 94 and notify the user of the timing.

For example, when it is assumed that the frequency control voltage data DVCX linearly changes along with the lapse of time, the failure detection circuit 13 may approximate the frequency control voltage data DVCX using a linear expression with respect to time and may predict the timing when the frequency control voltage VC deviates from the predetermined voltage range based on the linear expression.

For example, when it is assumed that the frequency control voltage data DVCX non-linearly changes along with the lapse of time, the failure detection circuit 13 may approximate the frequency control voltage data DVCX using a polynomial expression with respect to time and may predict the timing when the frequency control voltage VC deviates from the predetermined voltage range based on the polynomial expression.

The control IC 4 is an example of a "circuit apparatus". The voltage controlled oscillation circuit 114 provided in the fractional-N PLL circuit 45 is an example of a "first oscillation circuit", and the clock signal CK1 is an example of a "first clock signal". The oscillation circuit 124 provided in the PLL circuit 46 is an example of a "second oscillation circuit", and the clock signal CK2 is an example of a "second clock signal".

1-4. Operation and Effect

As described above, according to the oscillator 1 in the first embodiment, in the control IC 4, the failure detection circuit 13 monitors the frequency control voltage VC that changes along with the lapse of time, and thus it is possible to predict in advance a failure of the PLL circuit 46 due to aging of the voltage controlled type oscillation circuit 124.

According to the oscillator 1 in the first embodiment, in the control IC 4, the failure detection circuit 13 can accurately predict the timing when the PLL circuit 46 fails based on the frequency control voltage data DVCX corresponding to the voltage component $VC_A$ that changes due to aging obtained by removing the voltage component $VC_T$ that changes according to the temperature from the frequency control voltage VC.

2. Second Embodiment

Hereinafter, in a second embodiment, the same reference signs are given to similar configurations as those in the first embodiment, similar description as that in the first embodiment will be omitted or simplified, and contents different from those in the first embodiment will be mainly described.

Since a structure of the oscillator 1 in the second embodiment is the same as that in FIGS. 1 to 4, illustration and description thereof are omitted.

FIG. 12 is a functional block diagram of the oscillator 1 in the second embodiment. As shown in FIG. 12, in the oscillator 1 in the second embodiment, the CPU 10 functions as the failure detection circuit 13 and a filter circuit 14 in the control IC 4 by executing the failure detection program transferred to the memory 15.

Similarly to the first embodiment, the failure detection circuit 13 calculates the frequency control voltage data DVCX corresponding to the voltage component $VC_A$ due to aging obtained by removing the voltage component $VC_T$ that changes according to the temperature from the frequency control voltage VC. The filter circuit 14 performs filter processing on the frequency control voltage data DVCX. The filter processing is processing for attenuating a short-term variation in the frequency control voltage data DVCX, and may be, for example, low-pass filter processing or Kalman filter processing.

The failure detection circuit 13 may approximate, using a polynomial expression with respect to time, data obtained by performing the filter processing on the frequency control voltage data DVCX using the filter circuit 14, and may predict the timing when the frequency control voltage VC deviates from the predetermined voltage range based on the polynomial expression.

Since the other configurations of the oscillator 1 in the second embodiment are the same as those in the first embodiment, description thereof will be omitted.

According to the oscillator 1 in the second embodiment described above, the same effects as those of the oscillator 1 in the first embodiment are obtained.

Further, according to the oscillator 1 in the second embodiment, in the control IC 4, the filter circuit 14 performs the filter processing on the frequency control voltage data DVCX to allow an unnecessary signal component such as a short-term variation to be attenuated, and thus the failure detection circuit 13 can accurately predict the timing when the PLL circuit 46 fails.

3. Modifications

The disclosure is not limited to the embodiments, and various modifications can be made within the scope of the gist of the disclosure.

In each of the above embodiments, the failure detection circuit 13 monitors the frequency control voltage VC and detects whether there is a possibility that the frequency control voltage VC deviates from the predetermined voltage range in which the oscillation circuit 124 is capable of operating normally. In this regard, the failure detection circuit 13 may use the output voltage from the low-pass filter 113 provided in the fractional-N PLL circuit 45 as the frequency control voltage, monitor the frequency control voltage, and detect whether there is a possibility that the frequency control voltage deviates from the predetermined voltage range in which the voltage controlled oscillation circuit 114 is capable of operating normally. In this case, the oscillation circuit 81 provided in the oscillation IC 8 is an example of the "first oscillation circuit", and the oscillation signal OSCO is an example of the "first clock signal". The voltage controlled oscillation circuit 114 provided in the fractional-N PLL circuit 45 is an example of the "second oscillation circuit", and the clock signal CK1 is an example of the "second clock signal".

In the above embodiments, the temperature control element 71 and the temperature sensor 72 are built in the heat generation IC 7, and alternatively, the temperature control element 71 and the temperature sensor 72 may be provided separately. In the above embodiments, the temperature sensor 82 is built in the oscillation IC 8, and alternatively, the temperature sensor 82 and the oscillation IC 8 may be provided separately. In the above embodiments, the temperature sensor 42 is built in the control IC 4, and alternatively, the temperature sensor 42 and the control IC 4 may be provided separately. In such cases, for example, the temperature sensors 72, 82, and 42 may be thermistors or platinum resistance sensors.

In the above embodiments, the control IC 4 includes one temperature sensor 42, and alternatively, a plurality of temperature sensors may be provided. In this case, for example, the A/D conversion circuit 43 may convert a plurality of temperature detection signals output from the plurality of temperature sensors into a plurality of temperature codes, and the microcontroller 40 may perform temperature control or temperature compensation based on the plurality of temperature codes. For example, the microcontroller 40 may perform temperature control or temperature compensation using an average value of the plurality of temperature codes as the temperature code DTS3.

In the above embodiments, temperature compensation is performed by controlling the division ratio of the fractional-N PLL circuit 45 based on the division ratio control signal DIVC output from the microcontroller 40, but the temperature compensation method is not limited thereto. For example, the oscillation circuit 81 built in the oscillation IC 8 may include a capacitor array, and the temperature compensation may be performed by selecting a capacitance value of the capacitor array based on a temperature compensation code DCMP calculated by the microcontroller 40. For example, the oscillation circuit 81 may include a variable capacitance element for adjusting a frequency, and the temperature compensation may be performed by converting the temperature compensation code DCMP calculated by the microcontroller 40 into an analog signal with the D/A conversion circuit and controlling a capacitance value of the variable capacitance element based on the analog signal.

In the above embodiments, one A/D conversion circuit 43 converts the voltages of the temperature detection signals TS1, TS2, TS3, and the frequency control voltage VC into the temperature codes DTS1, DTS2, DTS3, and the frequency control code DVC in a time-division manner, respectively, and for example, the control IC 4 may include a plurality of A/D conversion circuits, and the plurality of A/D conversion circuits may convert the voltages of the temperature detection signals TS1, TS2, TS3, and the frequency control voltage VC into the temperature codes DTS1, DTS2, DTS3, and the frequency control code DVC, respectively.

In the above embodiments, the temperature control element 71 is a heat generation element such as a CMOS transistor, and as long as the temperature control element 71 is an element that can control the temperature of the resonator element 6, the temperature control element 71 may be a heat absorbing element such as a Peltier element depending on a relationship between the target set temperature of the temperature of the resonator element 6 and the outside air temperature.

The embodiments and the modifications described above are examples, and the disclosure is not limited thereto. For example, the embodiments and the modifications may be combined as appropriate.

The disclosure includes configurations that are substantially identical to the configurations described in the embodiments, for example, configurations having the same function, method, and result, or configurations having the same object and effect. The disclosure includes configurations obtained by replacing non-essential portions of the configurations described in the embodiments. The disclosure includes configurations that can obtain the same function and effect and configurations that can accomplish the same object as the configurations described in the embodiments. The disclosure includes configurations obtained by adding a known technique to the configurations described in the embodiments.

The following contents are derived from the embodiments and the modifications described above.

An aspect of a circuit apparatus includes:

a first oscillation circuit configured to generate a first clock signal;

a PLL circuit including a second oscillation circuit configured to generate a second clock signal and a frequency control voltage generation circuit configured to generate a frequency control voltage for controlling a frequency of the second clock signal, the PLL circuit being configured to synchronize a phase of the second clock signal with a phase of the first clock signal; and a failure detection circuit configured to monitor the frequency control voltage and detect whether there is a possibility that the frequency control voltage deviates from a predetermined voltage range in which the second oscillation circuit is capable of operating normally.

According to this circuit apparatus, a failure of the PLL circuit due to aging of the voltage controlled type second oscillation circuit can be predicted in advance by monitoring the frequency control voltage that changes along with a lapse of time.

An aspect of the circuit apparatus further includes:

an A/D conversion circuit configured to perform A/D conversion on the frequency control voltage and a temperature detection voltage, in which the failure detection circuit may calculate, based on an A/D conversion result of the frequency control voltage and an A/D conversion result of the temperature detection voltage, frequency control voltage data obtained by removing a voltage component that changes according to a temperature from the frequency control voltage, and predict, based on the frequency control voltage data, a timing when the frequency control voltage deviates from the predetermined voltage range.

According to the circuit apparatus, it is possible to accurately predict the timing when the PLL circuit fails, based on the frequency control voltage data corresponding to a voltage component that changes due to aging obtained by removing the voltage component that changes according to the temperature from the frequency control voltage.

In an aspect of the circuit apparatus, the failure detection circuit may approximate the frequency control voltage data using a linear expression with respect to time and predict the timing based on the linear expression.

In an aspect of the circuit apparatus, the failure detection circuit may approximate the frequency control voltage data using a polynomial expression with respect to time and predict the timing based on the polynomial expression.

An aspect of the circuit apparatus further includes:

a filter circuit configured to perform filter processing on the frequency control voltage data, in which the failure detection circuit may approximate data, which is obtained by performing the filter processing on the frequency control voltage data using the filter circuit, using a polynomial expression with respect to time, and predict the timing based on the polynomial expression.

According to this circuit apparatus, an unnecessary signal component can be attenuated by performing the filter processing on the frequency control voltage data, and thus the timing when the PLL circuit fails can be accurately predicted.

In an aspect of the circuit apparatus, the filter processing may be low-pass filter processing.

According to this circuit apparatus, a short-term variation can be attenuated by performing the low-pass filter processing on the frequency control voltage data, and thus the timing when the PLL circuit fails can be accurately predicted.

In an aspect of the circuit apparatus, the second oscillation circuit may be coupled to a resonator and cause the resonator to oscillate to generate the second clock signal.

An aspect of an oscillator according to the disclosure includes the aspect of the circuit apparatus.

What is claimed is:

1. A circuit apparatus comprising:

a first oscillation circuit configured to generate a first clock signal;

a PLL circuit including a second oscillation circuit configured to generate a second clock signal and a frequency control voltage generation circuit configured to generate a frequency control voltage for controlling a frequency of the second clock signal, the PLL circuit being configured to synchronize a phase of the second clock signal with a phase of the first clock signal;

a failure detection circuit configured to monitor the frequency control voltage and detect whether there is a possibility that the frequency control voltage deviates from a predetermined voltage range in which the second oscillation circuit is capable of operating normally; and an A/D conversion circuit configured to perform A/D conversion on the frequency control voltage and a temperature detection voltage, wherein the failure detection circuit calculates, based on an A/D conversion result of the frequency control voltage and an A/D conversion result of the temperature detection voltage, frequency control voltage data obtained by removing a voltage component that changes according to a temperature from the frequency control voltage, and predicts, based on the frequency control voltage data, a timing when the frequency control voltage deviates from the predetermined voltage range.

2. The circuit apparatus according to claim 1, wherein the failure detection circuit approximates the frequency control voltage data using a linear expression with respect to time and predicts the timing based on the linear expression.

3. The circuit apparatus according to claim 1, wherein the failure detection circuit approximates the frequency control voltage data using a polynomial expression with respect to time and predicts the timing based on the polynomial expression.

4. The circuit apparatus according to claim 1, further comprising:

a filter circuit configured to perform filter processing on the frequency control voltage data, wherein the failure detection circuit approximates data, which is obtained by performing the filter processing on the frequency control voltage data using the filter circuit, using a polynomial expression with respect to time, and predicts the timing based on the polynomial expression.

5. The circuit apparatus according to claim 4, wherein the filter processing is low-pass filter processing.

6. The circuit apparatus according to claim 1, wherein the second oscillation circuit is coupled to a resonator and causes the resonator to oscillate to generate the second clock signal.

7. An oscillator comprising:
the circuit apparatus according to claim 1.

* * * * *